United States Patent [19]

Sakashita et al.

[11] Patent Number: 4,856,002
[45] Date of Patent: Aug. 8, 1989

[54] SEMICONDUCTOR INTEGRATED CIRCUIT APPARATUS

[75] Inventors: Kazuhiro Sakashita; Satoru Kishida; Toshiaki Hanibuchi; Ichiro Tomioka; Takahiko Arakawa, all of Hyogo, Japan

[73] Assignee: Mitsubishi Denki Kabushiki Kaisha, Tokyo, Japan

[21] Appl. No.: 62,439

[22] Filed: Jun. 12, 1987

[30] Foreign Application Priority Data

Aug. 4, 1986 [JP] Japan .................................. 61-183684

[51] Int. Cl.$^4$ ............................................. G01R 31/28
[52] U.S. Cl. ...................................... 371/21; 365/201; 371/25
[58] Field of Search ..................... 371/21, 25, 24, 15, 371/27; 365/200, 201

[56] References Cited

U.S. PATENT DOCUMENTS

| | | | |
|---|---|---|---|
| 4,701,921 | 10/1987 | Powell | 371/25 |
| 4,701,922 | 10/1987 | Kuboki | 371/25 |
| 4,710,931 | 12/1987 | Bellay | 371/25 |
| 4,710,933 | 12/1987 | Powell | 371/25 |
| 4,718,065 | 1/1988 | Boyle | 371/25 |
| 4,745,355 | 5/1988 | Eichelberger | 371/25 |

Primary Examiner—Michael R. Fleming
Attorney, Agent, or Firm—Wolf, Greenfield & Sacks

[57] ABSTRACT

A test circuit of a semiconductor integrated circuit apparatus comprising a latch circuit connected to an output terminal of a scan register for holding output data of the scan register stored before scanning in a scan mode during the test operation.

15 Claims, 8 Drawing Sheets

Fig. 1A
Fig. 1
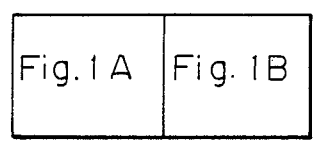
(PRIOR ART)
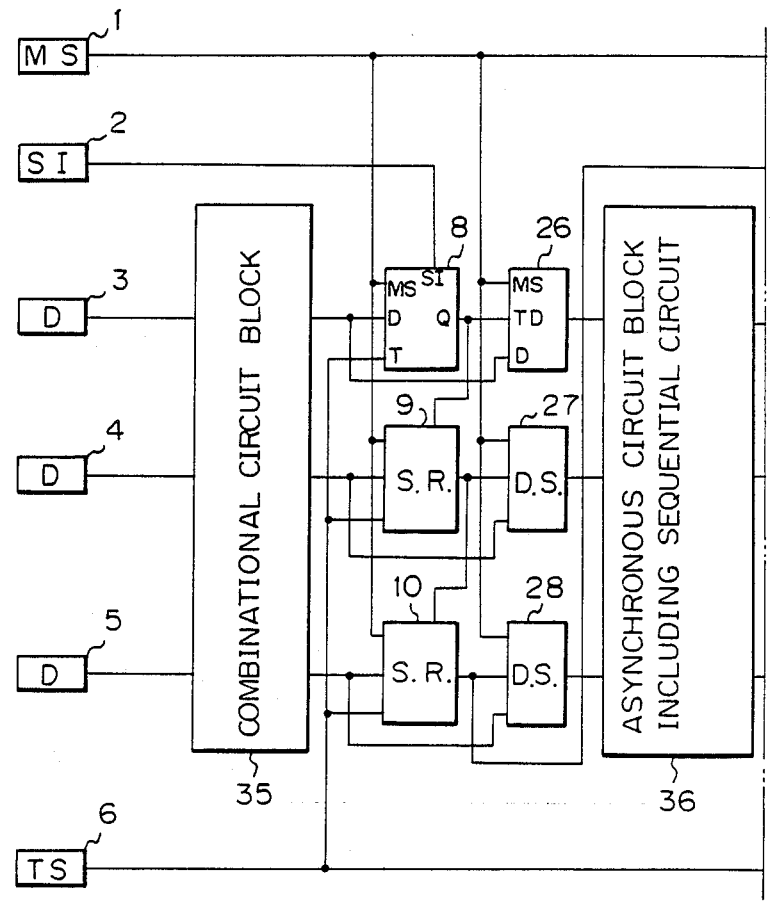

SEMICONDUCTOR INTEGRATED CIRCUIT APPARATUS

BACKGROUND OF THE INVENTION

1. Field of the Invention

The present invention relates to a semiconductor integrated circuit apparatus and, more particularly, to a test circuit of a semiconductor integrated circuit apparatus that uses a scan path.

2. Description of the Related Background Art

The integration degree or integration density of semiconductor integrated circuits has increased remarkably owing to progress in fine working techniques and following such a tendency the integration degree is expected to increase further in the future. With any increase in integration degree (the number of gates), the degree of difficulty in the testing of semiconductor integrated circuit apparatuses increases exponentially. The ease with which testing of a certain apparatus can be carried out is determined by two factors: the ease with which a failure can be detected at each terminal (observability) and the ease with which each terminal can be set to a desired logical value (controllability). In general, the observability and controllability of the deep terminals (portions far from the periphery) of a large scale logical circuit network are very poor.

The scan test method is recognized as one method of testing a semiconductor integrated circuit apparatus. According to the scan test method, register circuits having the shift register function are inserted at proper positions in the logical circuit network and these register circuits are connected by one shift register path. In the test mode, a test pattern signal is serially fed (input) from the outside of the integrated circuit chip and predetermined data is set into each register. Desired logical signals are applied to the logical circuits connected to the data output terminals of those register circuits, thereby operating the logical circuits. The results of the logical operations are fed from the parallel input terminals of the register circuits into the parallel register circuits. They are then serially output to the outside of the chip to be observed, thereby improving the observability and controllability of the deep terminal of the large scale logical circuit network.

The fundamental idea of the scan test method with respect to a level sensitive synchronous circuit is disclosed in Japanese Patent Publication No. 28614/1977.

Here, however, since the circuit to be tested also includes an asynchronous sequential circuit, an explanation of the prior art will now be made with reference to Japanese Patent Public Disclosure No. 74668/1981.

FIG. 1 shows an example of a conventional test circuit utilizing the scan path method to test an asynchronous type sequential circuit. In the diagram, reference numerals 35 and 37 denote combinational circuit blocks; numeral 36 denotes an asynchronous circuit block including a sequential circuit; numerals 8 to 16 denote scan registers (S.R.) provided between the circuit blocks; and numerals 26 to 34 denote data selectors (D.S.), each for selecting and feeding out (outputting) either the output of the corresponding circuit block or the output of the scan register. The output signal of each circuit block is directly connected to the data input terminal D of the scan registers and to the data input terminal D of the data selectors. On the other hand, the output terminal Q of the corresponding scan register is connected to the test data input terminal (TD) of the data selectors.

The test mode selection terminal (MS) 1 is connected to each mode selection terminal (MS) of the scan registers and data selectors. Numeral 2 denotes a scan-in terminal (SI) and numeral 38 denotes a scan-out terminal (SO). The scan-in terminal 2 is connected to the scan-in terminal SI of the scan register 8. The output terminal Q of the scan register 8 is connected to the scan-in terminal (SI) of the scan register 9. In this manner, the output terminal Q of each scan register is sequentially connected to the scan-in terminal (SI) of the next scan register. Thus, a shift register path is formed between the scan-in terminal 2 and the scan-out terminal 38. Numerals 3 to 5 denote ordinary data input terminals and numeral 6 denotes the scan clock input terminal (TS) connected to the clock input terminal T of the scan register.

FIG. 2 shows an example of the scan registers. MS denotes the mode selection terminal; D is the data input terminal; SI is the scan-in terminal; and T is the clock input terminal. On the other hand, reference numeral 51 denotes an inverter gate; numerals 52 and 53 two-input AND gates; numeral 54 a two-input OR gate; 55 an edge trigger D-type flip-flop (hereinafter, referred to as a D-FF); and Q the data output terminal.

FIG. 3 shows an example of the data selector circuits shown in FIG. 1. MS denotes the mode selection terminal; TD the test data input terminal; D the data input terminal; numeral 60 an inverter gate; numeral 61 and 62 two-input AND gates; numeral 63 a two-input OR gate; and Y an output terminal.

The operation will now be explained.

The operation in the ordinary operating mode will be first described. In this case, a high level ("H") signal is applied to the test mode selection terminal 1 (MS) and the scan clock terminal 6 (TS or T) is fixed to the low level ("L"). Thus, the input and output terminals of the corresponding circuit blocks are directly connected through each data selector.

This point will be explained with reference to FIG. 3. When the "H" signal is supplied to the mode selection terminal (MS), the data selector circuit transfers the data from the data input terminal D to the output terminal Y through the AND gate 62 and the OR gate 63. Since the output of the circuit block is directly connected to the data input terminal D of the data selector, the input and output terminals of the corresponding circuit blocks are directly connected.

However, in the testing operation, the scan mode and test mode are sequentially and repeatedly executed in the following manner, thereby testing each circuit block.

(1) Scan mode:

(a) By applying the "H" signal to the test mode selection terminal 1, the operating mode is set to the scan mode. Thus in the scan register (S.R.) the input data from the scan-in terminal (SI) is selected. In the data selector (D.S.) the input data from the data input terminal D is validated.

(b) Further, the test data set into each scan register is sequentially fed in from the scan-in terminal 2 in synchronism with a clock applied to the scan clock terminal 6. This process is hereinafter referred to as "scanning in".

(c) At the same time, the output data of each circuit block, which is taken in the preceding test mode, is sequentially fetched out from the scan-out terminal 38. This process is hereinafter referred to as "scanning out".

These operations will now be described with reference to FIGS. 2 and 3. First, in the scan register (FIG. 2), when the "H" signal is applied to the mode selection terminal (MS), the data from the scan-in terminal (SI) is fed to and held in the D-FF 55 through the AND gate 53 and the OR gate 54 in synchronism with a clock applied to the clock terminal T. At the same time, the data which has been held in the D-FF 55 is fed out (output) from the output terminal Q. At this time, since the "H" signal is also supplied to the mode selection terminal MS of the data selector (FIG. 3), the data from the data input terminal D is also supplied (output) to the output terminal Y of the data selector.

(2) Test mode:

(a) After the desired data has been set into each scan register, the "L" signal is supplied to the test mode selection terminal 1, thereby setting the operating mode into the test mode.

(b) Thus the output data of the scan register is applied to each circuit block through the test data input terminal TD of the data selector.

(c) Simultaneously, desired test data is applied to the data input terminals 3 to 5.

(d) After completion of the operation of the circuit blocks, one clock is applied to the scan clock input terminal 6. Thus, the output signal of each circuit block is fed to and held in the corresponding D-FF of the scan register, through the data input terminal D of the corresponding scan register.

These operations will now be explained with reference to FIGS. 2 and 3. First, when the "L" signal is supplied to the mode selection terminal MS in the scan register((FIG. 2), the data from the data input terminal D is fed to and held in the D-FF 55 through the AND gate 52 and the OR gate 54 in synchronism with a clock applied to the clock input terminal T. In this case, since the "L" signal is also supplied to the mode selection terminal MS of the data selector (FIG. 3), the data from the test data input terminal TD is fed out to the output terminal Y through the AND gate 61 and the OR gate 63.

Although the test of each circuit block in this circuit can be executed as described above, the data selector selects the output data of each circuit block during the scanning operation. Therefore, even when the output value of the scan register changes sequentially during the scanning operation, the state of the circuit block 36 including the sequential circuit is not changed. Accordingly, as in this example, even if the circuit block surrounded by the scan path is an asynchronous-type sequential circuit, a scan test can still be performed.

Since the conventional apparatus is constituted in the manner described above, a scan test of a block including an asynchronous sequential circuit can also be performed. However, in general, when the operating mode is switched from the test mode to the scan mode, the data to be supplied to the sequential circuit is changed from the serial input signal value to the output signal value of the adjacent circuit block. It is therefore difficult to set the input in such a manner that the state of the asynchronous sequential circuit to be tested does not change. In many cases, such a problem means that a scan test cannot be effectively performed.

SUMMARY OF THE INVENTION

The present invention was accomplished in order to solve the above-mentioned problems and it is an object of the invention to obtain a semiconductor integrated circuit apparatus which can easily perform a scan test of a circuit block including an asynchronous sequential circuit.

The semiconductor integrated circuit apparatus according to the present invention comprises: a latch circuit which is connected to the output terminal of a scan register and continuously supplies the output data of the scan register stored before performing the scanning operation in the scan mode during testing; and a selecting circuit for selecting either the output data of the circuit block of the previous stage in the ordinary operating mode or the output data of the latch circuit in the test mode, and for supplying the selected output data to the circuit block at the next stage.

In this invention, the input and output terminals of the corresponding circuit blocks are connected to each other in the ordinary operating mode. However, in the test mode, the output terminal of the latch circuit and the input terminal of the corresponding circuit block are connected to each other. In the scan mode, the test data applied previously is held in the latch circuit connected to the scan register, and this data is continuously applied to the corresponding circuit block.

The above and other objects and features of the present invention will become apparent from the following detailed description and the appended claims with reference to the accompanying drawings.

BRIEF DESCRIPTION OF THE DRAWINGS

FIGS. 1, 1A and 1B circuit diagrams showing a conventional semiconductor integrated circuit apparatus;

FIGS. 4, 4a and 4b are circuit diagrams showing a semiconductor integrated circuit apparatus according to an embodiment of the present invention;

FIGS. 7, 7a and 7b are a circuit diagrams showing a semiconductor integrated circuit apparatus according to another embodiment of the invention using the circuit shown in FIG. 6.

DETAILED DESCRIPTION OF THE PREFERRED EMBODIMENTS

Figure 1B:
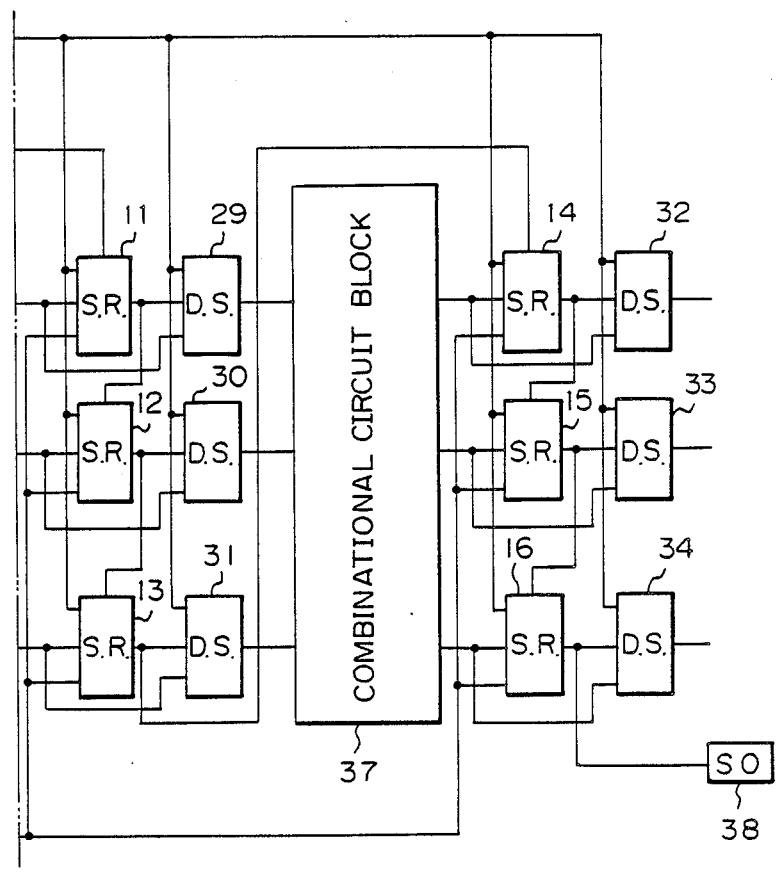
Figure 2:
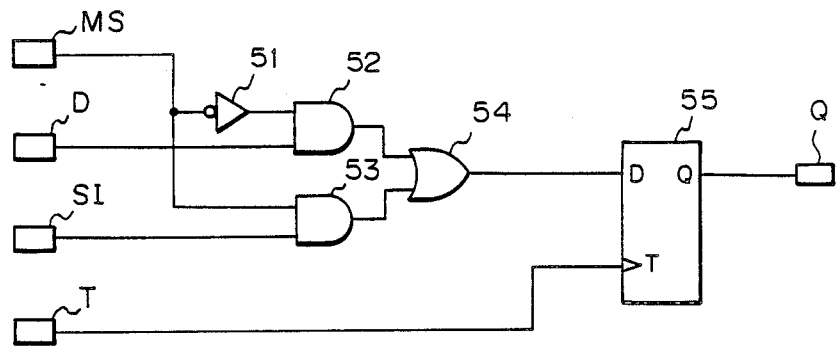
FIG. 2 is a diagram showing a scan register circuit in the conventional apparatus.
Figure 3:
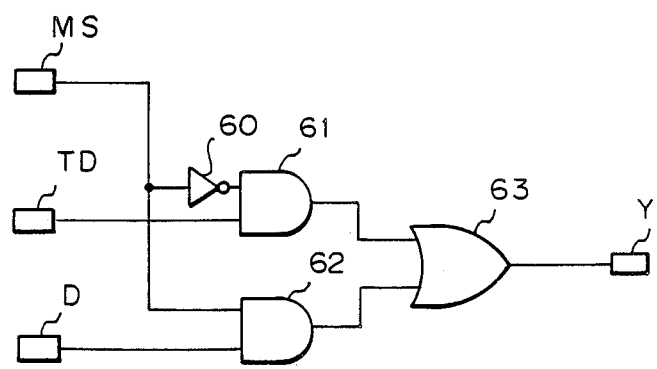
FIG. 3 is a diagram showing a selecting circuit in the conventional apparatus.
Figure 4A:
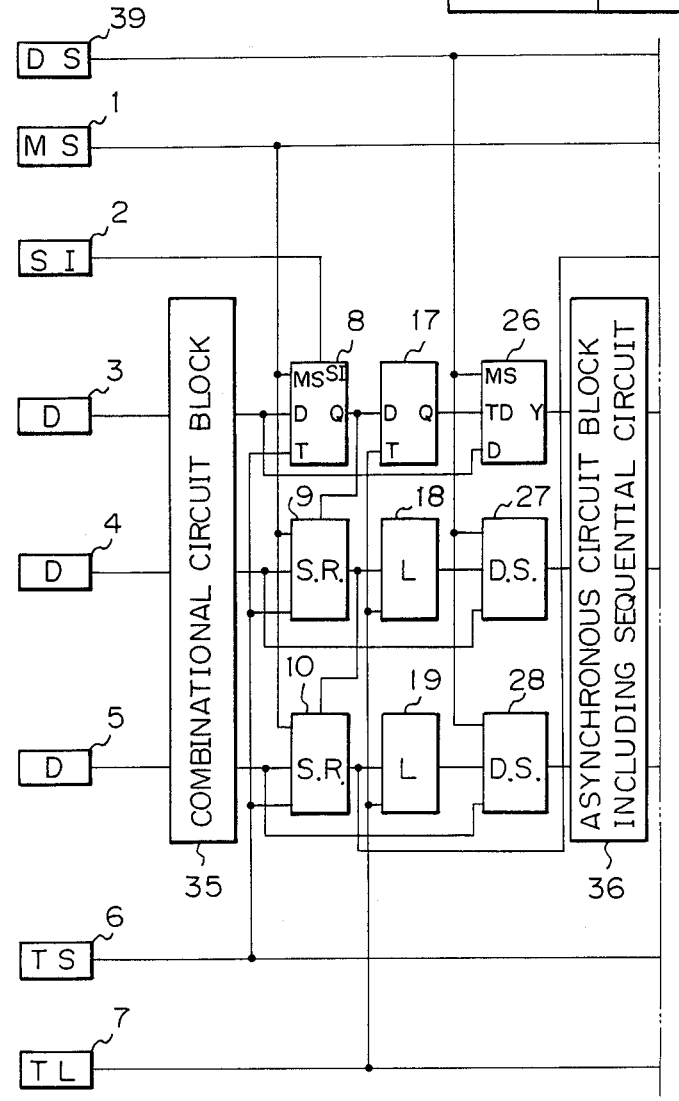
Figure 4B:
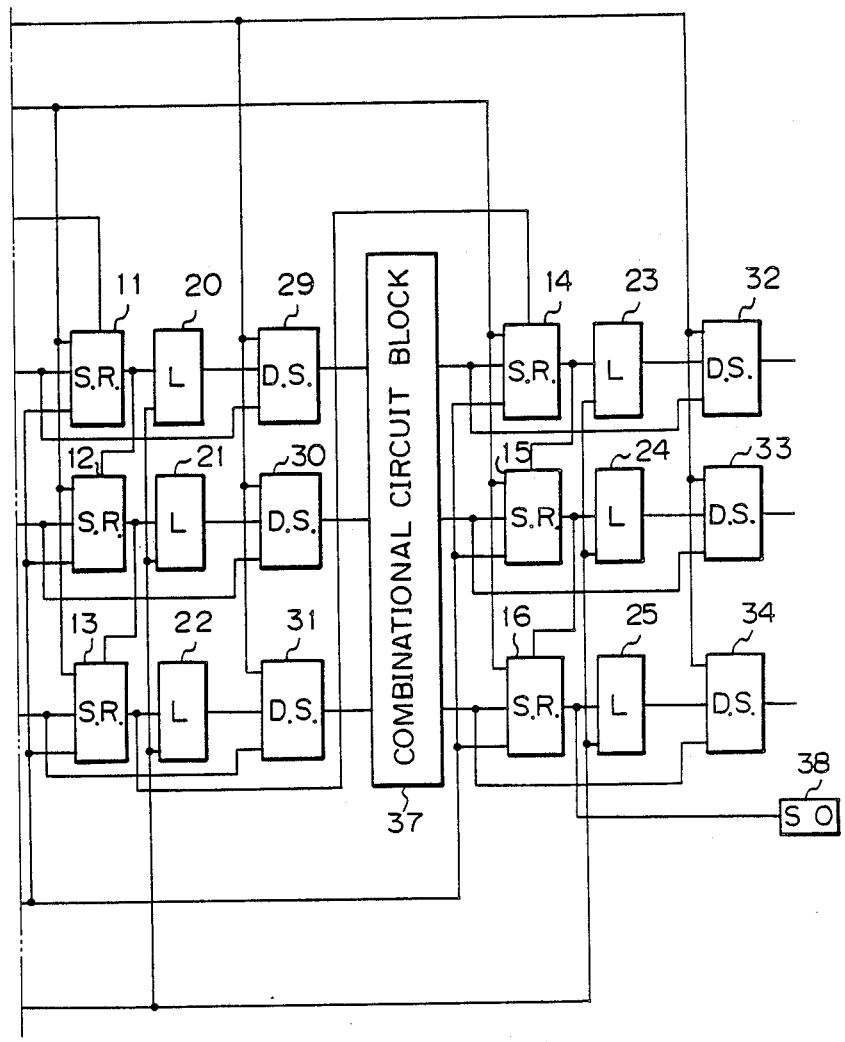

An embodiment of the present invention will be described hereinbelow, with reference to the drawings. FIG. 4 shows the constitution of a semiconductor integrated circuit apparatus according to an embodiment of the invention. In the diagram, reference numerals 35 and 37 denote the combinational circuit blocks; numeral 36 an asynchronous circuit block including a sequential circuit; numerals 8 to 16 scan registers (S.R.) provided among those circuit blocks, numerals 17 to 25 latch circuits (L), in each of which the output terminal Q of the scan register circuit is connected to the data input terminal D; and numeral 26 to 34 data selecting circuits (D.S.) each for selecting either the output of the corresponding circuit block or the output of the latch circuit. The output terminal Q of each latch circuit is connected to the test data input terminal (TD) of the corresponding selecting circuit. The output terminal of each circuit block is directly connected to the data input terminal D of the corresponding scan register and to the data input terminal D of the selecting circuit. The output terminal Y of each selecting circuit is connected to the input terminal of the corresponding circuit block.

The test mode selection terminal (MS) 1 is connected to the mode selection terminal (MS) of each scan register circuit. Numeral 2 denotes the scan-in terminal and numeral 38 denotes the scan-out terminal. The scan-in terminal (SI) 2 is connected to the scan-in terminal (SI) of the scan register 8. The output terminal Q of the scan register 8 is further connected to the scan-in terminal (SI) of the next scan register 9. Similarly, the output terminal Q of the scan register and the scan-in terminal (SI) of the next scan register are sequentially connected. Thus, one scan path is formed between scan-in terminal 2 and scan-out terminal 38. Numeral 6 denotes a scan clock input terminal (TS) and numeral 7 indicates a latch clock input terminal (TL). Scan clock input terminal 6 is connected to the clock input terminal T of each scan register. Clock input terminal 7 is connected to the clock input terminal T of each latch circuit. Numeral 39 represents a data selection terminal (DS) and this terminal is connected to the mode selection terminal (MS) of each selecting circuit. Numerals 3 to 5 denote ordinary data input terminals.

Figure 5:
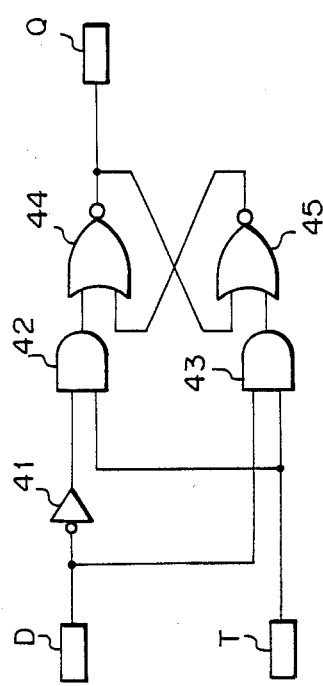
FIG. 5 is a diagram showing an example of the constitution of a latch circuit included in the apparatus of FIG. 4.

FIG. 5 shows an example of the constitution of the latch circuit. In the diagram, D indicates the data input terminal; T the clock input terminal; 41 an inverter; 42 and 43 two-input AND gates; 44 and 45 two-input NOR gates; and Q the output terminal of the latch circuit.

When a positive clock is applied to the clock input terminal T, the latch circuit holds the input data of the data input terminal D and simultaneously feeds out the held data supplied from the output terminal Q. As long as the "L" signal is applied to the clock input terminal T, the latch circuit executes the holding operation irrespective of the data value which is applied to the data input terminal D.

The operation will now be explained. Since the scan register circuit and selecting circuit operate in a manner similar to the conventional circuits, description of their operations is omitted here.

The operation in the ordinary operating mode will be first explained. In the ordinary operating mode, the "H" signal is supplied to data selection terminal 39, thereby allowing each selecting circuit to select the data of the data input terminal D. Thus, the respective circuit blocks are connected through each selecting circuit. The operation of the scan register circuit and the operation of the latch circuit are disregarded as having no effect on the circuit blocks. However, in the test mode, the operations in the scan and test modes are sequentially repeated in the following manner and each circuit block is tested.

(1) Scan mode:

(a) The "L" signal is supplied to data selection terminal 39, thereby allowing the selecting circuit to select the data on the side of the test data input terminal (TD). Hence, the output data of the latch circuit is supplied to the circuit block.

(b) Clock input terminal 7 is fixed to the "L" level and each latch circuit is set into the holding state. The previous test data is continuously supplied to the circuit block.

(c) The "H" signal is supplied to test mode selection terminal 1. The input data of the scan register (S.R.) is set to the scan-in terminal (SI).

(d) The test data which is set from scan-in terminal 2 to each scan register is sequentially "scanned in" synchronously with a clock applied to scan clock input terminal 6.

(e) At the same time, the output data of each circuit block obtained from the preceding test mode is sequentially "scanned out" from the scan-out terminal.

(2) Test mode:

(a) After the desired test data has been set into each scan register one positive clock is applied to the clock input terminal 7.

(b) Thus the test data set in the corresponding scan register is held in each latch circuit. The new test data is supplied to the circuit block.

(c) Simultaneously, the test data is also supplied from data input terminals 3 to 5.

(d) Next, the "L" signal is supplied to test mode selection terminal 1 and the input of the scan register is set to the data input terminal D.

(e) After the completion of the operation of each circuit block, one clock is applied through the scan clock input terminal 6. The output data of each circuit block is held in the scan register.

Thus, each circuit block can be tested in this manner, in the foregoing embodiment, the latch circuit not only holds the preceding test pattern during the scanning operation but also continuously supplies this pattern to the input terminal of each circuit block. Therefore, even while the value of the scan register changes sequentially during the scanning operation, the state of each circuit block does not change and the scan test of each circuit block can be easily performed.

Although the case where a scan register is constituted using a D-FF of the edge-trigger type has been described in the foregoing embodiment, the scan register may also be constituted using a master-slave type D-FF. Further, as shown in FIG. 6, a level sensitive scan register using a two-phase clock may also be used.

Figure 6:
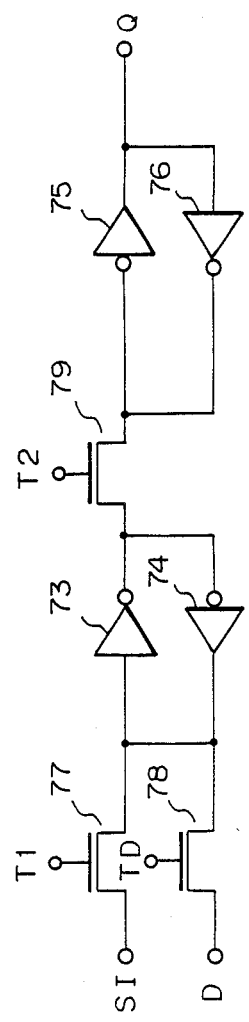
FIG. 6 is a circuit diagram showing a scan register circuit according to another embodiment of the invention.

In FIG. 6, numeral 73 to 76 denote inverters; numerals 77 to 79 indicate transmission gates of n-type MOS transistors; $T_1$ is a first scan clock input terminal; TD a data clock input terminal; and $T_2$ a second scan clock input terminal. In this constitution, the load driving capabilities of the inverters 74 and 76 are inferior to those of the other inverters. Therefore, when the transmission gates 77 to 79 are opened, the data corresponding to each latch is held.

In the shift operation, input clocks are applied to the respective clock input terminals $T_1$, TD, and $T_2$ so that the transmission gates 77 to 79 are not simultaneously turned on.

Figure 7A:
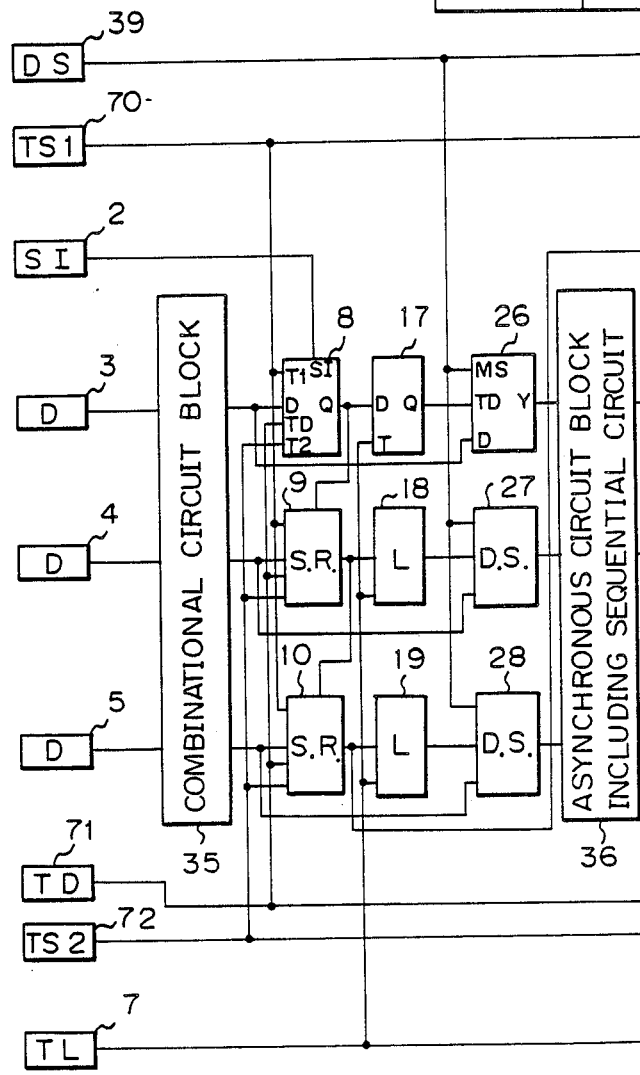
Figure 7B:
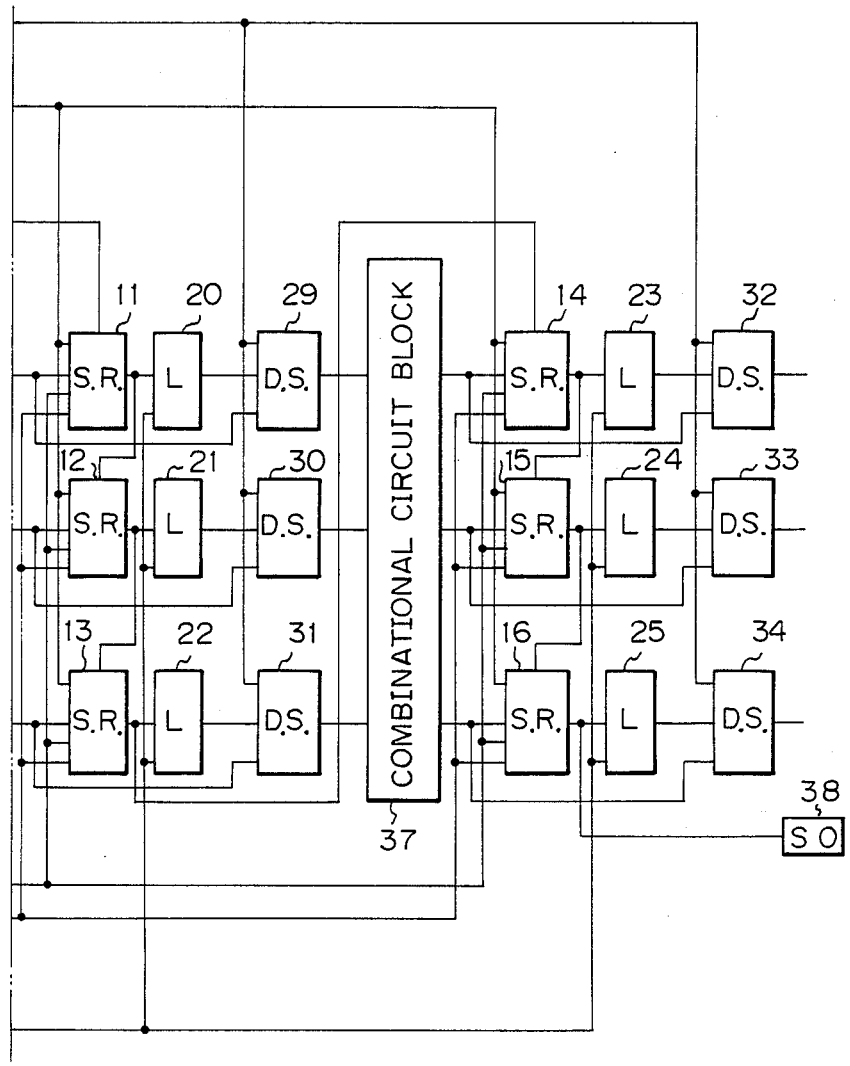

FIG. 7 shows an embodiment using the scan register as shown in FIG. 6. Numerals 70 and 71 denote clock input terminals corresponding to the scan clock input terminal $T_1$ and the data clock input terminal (TD) of the scan register, respectively. These clock input terminals also serve as selection signals of the input data to the latch circuit at the first stage of the scan register. Numeral 72 represents a clock input terminal for shifting the data held in the latch circuit at the first stage to the latch circuit at the second stage in the scan register. An effect similar to the first mentioned embodiment can also be obtained by the just mentioned embodiment.

As described above, according to the invention, a latch circuit is connected to the output terminal of the scan register. Further, a selecting circuit is provided to select either the output data of the latch circuit or the output data of the corresponding circuit block at the first stage. The output terminal of the selecting circuit is connected to the input terminal of the corresponding circuit block. Therefore, in the ordinary operating mode, the signal can be transmitted and received between the circuit blocks independently of the scan register circuit. Further, in the scan mode of the test operation, the test pattern received before the scanning operation is held and can be continuously supplied to the circuit block at the next stage. Thus, the scan test of the asynchronous sequential circuit can be easily performed. It is therefore possible to obtain a large scale semiconductor integrated circuit apparatus including an asynchronous sequential circuit in which the test circuit can be easily designed with a minimal design cost.

Having described preferred embodiment of the invention, it will be apparent to those skilled in the art that many changes and modifications may be made without departing from the concepts of the invention.

What is claimed is:

1. In a semiconductor integrated circuit having computational circuitry which can be divided into a plurality of circuit blocks, each of said circuit blocks having an input and an output, said integrated circuit having self-test apparatus comprising a plurality of scan registers serially connected to form a shift register path, one of said scan registers having an output and a parallel-load input connected to the output of a first of said circuit blocks, and first means for selectively connecting said first circuit block output and said one scan register output to the input of a second of said circuit blocks, the improvement comprising:
   means responsive to an output signal at said one scan register output for temporarily storing said output signal, and
   second means for connecting said first circuit block output and said temporary storage means output to said first connecting means so that said first circuit block output and said temporary storage means output can selectively be connected to said second circuit block input.

2. In a semiconductor integrated circuit, the improvement according to claim 1 wherein said means for temporarily storing comprises a latch circuit.

3. In a semiconductor integrated circuit, the improvement according to claim 2 wherein said latch circuit is controlled by a clock signal to temporarily store said output signal.

4. In a semiconductor integrated circuit, the improvement according to claim 2 wherein said first connecting means comprises a data selector circuit having a first input connected to the output of said first circuit block input and a second input connected to said temporary storage means output.

5. In a semiconductor integrated circuit, the improvement according to claim 2 wherein said scan registers and said first connecting means are controlled by a first clock signal and said latch circuit is controlled by a second clock signal.

6. A semiconductor integrated circuit comprising:
   a plurality a plurality of circuit blocks, each of said circuit blocks having an input and an output;
   a plurality of scan registers serially connected to form a shift register path, one of said scan registers having a parallel-load input connected to the output of a first of said circuit blocks and an output;
   means for temporarily storing a signal at said output of said one scan register; and
   means for selectively connecting said first circuit block output and said temporary storage means output to the input of a second of said circuit blocks so that said first circuit block output and said temporary storage means output can selectively be connected to said second circuit block input.

7. A semiconductor integrated circuit according to claim 6 wherein said means for temporarily storing comprises a latch circuit.

8. A semiconductor integrated circuit according to claim 7 wherein said latch circuit is controlled by a clock signal to temporarily store said output signal.

9. A semiconductor integrated circuit according to claim 7 wherein said connecting means comprises a data selector circuit having a first input connected to the output of said first circuit block input and a second input connected to said temporary storage means output.

10. A semiconductor integrated circuit according to claim 6 wherein said scan registers and said connecting means are controlled by a first clock signal and said latch circuit is controlled by a second clock signal.

11. A semiconductor integrated circuit according to claim 6 wherein said scan registers and said connecting means are controlled by a first clock signal and said latch circuit is controlled by a second clock signal.

12. A semiconductor integrated circuit according to claim 6 wherein said one of said scan registers are controlled by a first selection signal to load signals at said parallel-load input and said connecting means are controlled by a second selection signal to selectively connect said first circuit block output and said temporary storage means output to the input of a second of said circuit blocks.

13. An integrated circuit test apparatus for use in conjunction with a plurality of circuit blocks, each of said circuit blocks having an input and an output, said test apparatus comprising:
   connecting means for selectively connecting the output of a first of said circuit blocks to the input of a second of said circuit blocks and for isolating said second circuit block input from said first circuit block output;
   storage means, connected to said connecting means, for temporarily storing test data and supplying said test data to said second circuit block input; and
   a multiple-stage shift register means, connected to said first circuit block and said storage means, for accepting external serially-entered data or data from said first circuit block output and for propagating said data therethrough.

14. An integrated circuit test apparatus, having a normal, a scan, and a test operational mode, for use in conjunction with a plurality of logic circuit blocks, each of said logic circuit blocks having an input and output, said integrated circuit test apparatus comprising:
   a plurality of scan registers connected serially to form a shift register path, each of said scan registers having an output and a parallel-load input connected to the output of a first of said logic circuit blocks;

latch means, responsive to a signal present at the output of one of said scan registers, for temporarily storing said signal, said latch means further having an output; and means for selectively connecting said first logic circuit block output and said latch means output to an input of a second of said logic circuit blocks, so that said second logic circuit block input is connected to said first logic circuit block output during said normal operational mode, said second logic circuit block input is connected to said latch means output during said scan and said test operational modes, and said second logic circuit block input is disconnected from said first logic circuit block output during said scan operational mode.

15. An integrated circuit test apparatus, having a normal, a scan and a test operational mode, for use in conjunction with a plurality of logic circuit blocks, at least one of said circuit blocks containing sequential circuitry, each of said circuit blocks having an input and output, said integrated circuit test apparatus comprising:

a plurality of scan registers connected serially to form a shift register path, each of said scan registers having an output and a parallel-load input connected to the output of a first of said circuit blocks;

latch means, responsive to a signal present at the output of one of said scan registers, for temporarily storing said signal, said latch means further having an output; and means for selectively connecting said first circuit block output and said latch means output to an input of a second of said circuit blocks, so that in said normal mode of operation, said output of said first circuit block is connected to the input of said second circuit block, allowing normal interaction of said circuit blocks; in said scan mode of operation, the contents of said latch means is supplied to the inputs of said second circuit block, and test data is synchronously entered into said scan registers while test result contents in the scan registers are synchronously extracted from said scan registers, and in said test mode of operation, said test data contained in said scan registers is clocked into said latch means and supplied to said second circuit block input during testing of said second circuit block, said test results being clocked into said scan registers, whereby alternately repeating said scan mode and said test mode enables testing of each of said circuit blocks.

* * * * *